(12) United States Patent
East et al.

(10) Patent No.: US 10,714,673 B2
(45) Date of Patent: Jul. 14, 2020

(54) TRANSDUCERS WITH IMPROVED IMPEDANCE MATCHING

(71) Applicant: Google LLC, Mountain View, CA (US)

(72) Inventors: James East, Cambridge (GB); Neil John Harris, Cambridge (GB)

(73) Assignee: Google LLC, Mountain View, CA (US)

( * ) Notice: Subject to any disclaimer, the term of this patent is extended or adjusted under 35 U.S.C. 154(b) by 456 days.

(21) Appl. No.: 15/806,823

(22) Filed: Nov. 8, 2017

(65) Prior Publication Data

US 2018/0102471 A1    Apr. 12, 2018

Related U.S. Application Data

(63) Continuation of application No. 14/396,318, filed as application No. PCT/GB2013/051028 on Apr. 23, 2013, now abandoned.

(30) Foreign Application Priority Data

Apr. 23, 2012 (GB) .................................. 1207045.4

(51) Int. Cl.
*H01L 41/09* (2006.01)
*H01L 41/053* (2006.01)
(Continued)

(52) U.S. Cl.
CPC .......... *H01L 41/053* (2013.01); *B06B 1/0603* (2013.01); *G10K 11/004* (2013.01);
(Continued)

(58) Field of Classification Search
CPC . H01L 41/053; H01L 41/0933; H01L 41/094; H04R 17/00; H04R 7/045; G10K 11/004; G10K 11/02
(Continued)

(56) References Cited

U.S. PATENT DOCUMENTS

| 2,326,923 | A | 8/1943 | Bokovoy |
| 4,642,511 | A | 2/1987 | Chason |
| 4,736,129 | A | 4/1988 | Endo |
| 6,262,517 | B1 | 7/2001 | Schmidt |

(Continued)

FOREIGN PATENT DOCUMENTS

| CN | 1666568 | 9/2005 |
| CN | 1849842 | 10/2006 |

(Continued)

OTHER PUBLICATIONS

Japanese Office Action dated Feb. 14, 2017 in corresponding Japanese Application No. 2015-507593 (11 pages with English translation).

(Continued)

*Primary Examiner* — Thomas M Dougherty
(74) *Attorney, Agent, or Firm* — Fish & Richardson P.C.

(57) ABSTRACT

A transducer (140) having a mechanical impedance over an operative frequency range and having a desired power coupling (145) to a load over the operative frequency range comprises a piezoelectric device (141) having a frequency distribution of modes in the operative frequency range; and an overmould (143). The overmould (143) is arranged to surround at least part of the piezoelectric device (141); and the parameters of the overmould (143) are selected to provide a required impedance matching between the mechanical impedance of the transducer (140) and the mechanical impedance of the load. An alternative transducer comprises a mounting means for holding a discrete portion of at least a part of the periphery of the piezoelectric device wherein the parameters of the mounting means are selected to provide a required boundary condition for the periphery of the piezoelectric device whereby the desired power coupling between the transducer and the load is provided.

20 Claims, 12 Drawing Sheets

(51) Int. Cl.
  *B06B 1/06* (2006.01)
  *G10K 11/00* (2006.01)
  *G10K 11/02* (2006.01)
  *H04R 17/00* (2006.01)
  *H04R 7/04* (2006.01)

(52) U.S. Cl.
  CPC ............ *G10K 11/02* (2013.01); *H04R 17/00* (2013.01); *H01L 41/094* (2013.01); *H01L 41/0933* (2013.01); *H04R 7/045* (2013.01)

(58) Field of Classification Search
  USPC .................. 310/311, 324, 328, 340, 348–351
  See application file for complete search history.

(56) References Cited

U.S. PATENT DOCUMENTS

| | | | |
|---|---|---|---|
| 2002/0027400 A1 | 3/2002 | Toda | |
| 2002/0156379 A1 | 10/2002 | Angelsen et al. | |
| 2007/0025574 A1 | 2/2007 | Azima | |
| 2010/0051242 A1* | 3/2010 | Arik | F15D 1/00 165/104.33 |

FOREIGN PATENT DOCUMENTS

| | | |
|---|---|---|
| EP | 2373057 | 10/2011 |
| JP | 1999-164396 | 12/2000 |
| JP | 2006-352464 | 12/2006 |
| JP | 2007-505540 | 3/2007 |
| JP | 2008-061081 | 3/2008 |
| JP | 2010-027500 | 2/2010 |
| JP | 2010-528547 | 8/2010 |
| JP | 2011-133058 | 7/2011 |
| WO | WO 2005/025267 | 3/2005 |

OTHER PUBLICATIONS

Chinese Office Action dated Mar. 3, 2016 in counterpart Chinese Application No. 201380032985.x (29 pages in Chinese with English translation).

International Search Report for PCT/GB2013/051028, dated Jun. 8, 2013.

KP Office Action in Korean Appln. No. 10-2014-7032763, dated Feb. 19, 2019, 12 pages (with English translation).

* cited by examiner

TRANSDUCERS WITH IMPROVED IMPEDANCE MATCHING

TECHNICAL FIELD

The following relates to improvements to transducers, also referred to as actuators.

BACKGROUND

FIG. 1 shows an explanatory diagram of an ideal simply supported distributed mode actuator (piezoelectric actuator) 10; this is also referred to as a transducer. A piezoelectric resonant element 11 is held in ideal simply supported mounts 12. The mounts 12 inhibit any translational movement of element 11 in any direction, whist allowing for rotational movement about a point of rotation at the end of the beam. This constitutes an ideal simple support. The transducer is shown mounted to a mechanical ground 13, and is coupling power or force or velocity 14 into a load which is not shown.

FIG. 2 shows an explanatory diagram of an inertial piezoelectric actuator 20; also referred to as a transducer. A piezoelectric resonant element 21 is mounted on a coupler 22. The coupler 22 is itself mounted to the load to be driven 23. The coupler 22 couples a power or force or velocity 24 into the load 23.

FIG. 3 shows a representation of the velocity and force of a representative transducer as shown in either FIG. 1 or FIG. 2 as a function of load impedance, with the resultant power also shown. A load impedance varies from zero to a maximum (which is infinite), but is here indicated as 1.

The velocity of the resonant element of the representative transducer is shown. This has a maximum at zero load impedance and is termed the free velocity. The velocity has a minimum at maximum or infinite load impedance.

The force that is provided to the load by the resonant element of the transducer is also shown. This has a minimum at zero load impedance and rises to a maximum at the maximum or infinite load impedance.

The power that is available to be coupled from the transducer to the load is shown, where power is the product of force×velocity.

Ideally the desired force, velocity and power is required to be coupled from the transducer to the load impedance over the frequency range of operation of the transducer, which may extend from 50,000 Hz down to effectively 0 Hz, which covers but is not limited to an audio frequency range. The power that can be coupled from the transducer to the load impedance can be thought of as a figure of merit for the transducer, and the problems associated with coupling a transducer to a load may be easily understood when considering the power.

In some transducer applications, it is desired to couple a maximum velocity to a load, whereas in some transducer applications it is desired to couple a maximum force to a load. In either or both of these situations it may be desired to couple a maximum possible power to the load available for a particular transducer design thereby minimising the required size of transducer for a particular application.

In order to effectively couple the desired power from the transducer to the load, the mechanical impedance of the transducer should be matched to that of the load over the frequency range of interest, which would also result in a relatively smooth variation in power, force and velocity with frequency.

In FIG. 4 a representation of impedance matching between a load and a transducer is shown, with the resultant power coupled from the transducer to the load also shown. In an ideal situation the load and transducer impedances are matched, as represented by the inclined solid line, leading to a maximum power transfer as a function of the available power represented by the horizontal solid line at a power transfer level arbitrarily shown as 1. This means that in an ideal situation when the impedances are matched the maximum amount of available power may be transferred from the transducer to the load. However, if the transducer and load impedances are not matched, for example the transducer impedance is greater than or smaller than the load impedance, then the power transfer can be significantly reduced, for example by an order of magnitude. This means that in this situation when the impedances are not matched less than the maximum amount of available power may be transferred from the transducer to the load where this is represented in FIG. 4, where the dashed inclined line indicates that there is an impedance mismatch between the load and the transducer resulting in a much reduced power transfer, as indicated by the horizontal dashed line.

Transducer and load impedances are frequently not matched over the frequency range of operation leading to reduced power transfer, velocities or forces, and to variations of power, force or velocity that are do not smoothly vary with frequency.

The present invention was made in an attempt to solve these problems.

SUMMARY

In one aspect there is provided in the following a transducer having a mechanical impedance over an operative frequency range and having a desired power coupling to a load over the operative frequency range, the transducer comprising;
  a piezoelectric device having a frequency distribution of modes in the operative frequency range; and
  an overmould, wherein
    the overmould is arranged to surround at least part of the piezoelectric device; and
    the parameters of the overmould are selected to provide a required impedance matching between the mechanical impedance of the transducer and the mechanical impedance of the load, whereby,
    the desired power coupling between the transducer and the load is provided.

In another aspect there is provided a transducer having an operative frequency range, and having a desired power coupling to a load over the operative frequency range, the transducer comprising;
  a piezoelectric device having a frequency distribution of modes in the operative frequency range;
  a mounting means for holding a discrete portion of at least a part of the periphery of the piezoelectric device; and
  wherein,
    the parameters of the mounting means are selected to provide a required boundary condition for the periphery of the piezoelectric device, whereby,
  the desired power coupling between the transducer and the load is provided.

In another aspect there is provided a transducer having a mechanical impedance over an operative frequency range and having a desired power coupling to a load over the operative frequency range, the transducer comprising;

a piezoelectric device having a frequency distribution of modes in the operative frequency range; and impedance matching means at least partially surrounding the piezoelectric device;

wherein the parameters of the impedance matching means are selected to provide a required impedance matching between the mechanical impedance of the transducer and the mechanical impedance of the load, whereby, the desired power coupling between the transducer and the load is provided.

In another aspect there is provided a method of manufacturing a transducer having a mechanical impedance over an operative frequency range and having a desired power coupling to a load over the operative frequency range, the method comprising;

providing a piezoelectric device having a frequency distribution of modes in the operative frequency range; and overmoulding impedance matching means onto the device so as to at least partially surrounding the piezoelectric device;

wherein the parameters of the impedance matching means are selected to provide a required impedance matching between the mechanical impedance of the transducer and the mechanical impedance of the load, whereby, the desired power coupling between the transducer and the load is provided.

In another aspect there is provided a transducer comprising;

a piezoelectric device in the form of a panel; and a support, the support comprising an elastomeric element and a mechanical ground, the elastomeric element supporting the device at least at a part of the periphery of the device and at least a part of the device extending through the elastomeric element into a recess in the mechanical ground.

Embodiments of the transducers and method described above will now be described by way of example only and with reference to the accompanying drawings. Reference is made to a piezoelectric actuator, where this includes actuators or transducers such as modal actuators, Distributed Mode Actuators (DMAs) and other types of actuators and transducers.

DETAILED DESCRIPTION

In the following there is generally disclosed a transducer that can be used to couple a desired power to a load.

Both simply supported and inertial transducers are described, in relation to providing a desired power coupling from the transducer to a load. The coupling of a desired force and/or velocity may also be a consideration for such a transducer and aspects of the transducer described below also apply to these parameters.

An inertial transducer is a transducer that is not grounded to a frame or other support and is free to vibrate over an extended region such as the region outside its mounting. For a resonant element, the resonant element is free to bend and so generate a force via the inertia associated with accelerating and decelerating its own mass during vibration. Inertial transducers may be symmetrical or asymmetrical where symmetrical transducers may be formed by a piezoelectric element supported symmetrically on a central coupler or support and asymmetrical transducers may for example be supported in a cantilever type arrangement.

Furthermore, a resonant element of a piezoelectric element of a transducer may have three distinguishable boundary conditions, namely free, clamped (or fixed) and simply supported (or pinned). For the simply supported case, displacement in any axis is prevented but rotation is allowed. A simple support is thus understood as a technical term in acoustical engineering to define the boundary condition of a resonant plate or beam. The plate of the transducer is supported to permit pivotal movement about the support but to prevent translational movement relative to the support. A simple support is thus distinguished from other boundary conditions where the plate is clamped at its edge or where the plate is free at its edge.

To optimise the performance of a piezoelectric actuator or transducer, it is worthwhile to understand what the benchmark performance is for such a system.

Figure 5:
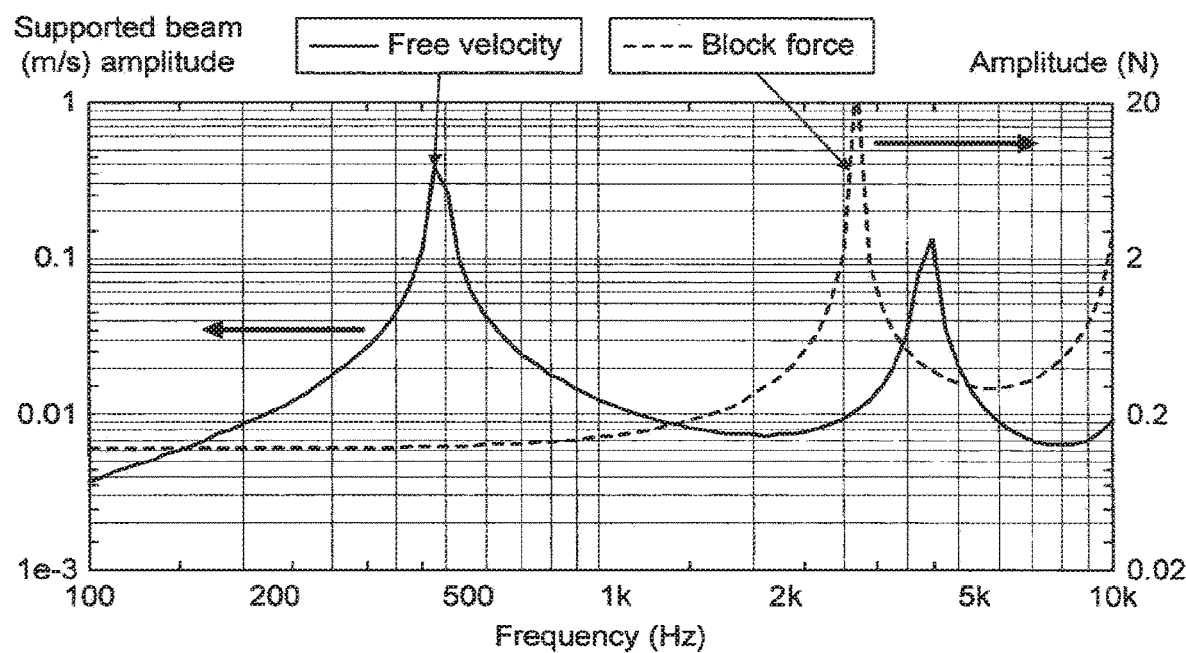
FIG. 5 shows the free velocity (with no load impedance) and block force (with infinite load impedance) as a function frequency for an ideal simply supported piezoelectric actuator.

The benchmark performance for a simply supported, or supported beam, transducer is shown in FIG. 5. The frequency range of operation is shown varying from 100 Hz to 10,000 Hz. The free velocity (with zero load impedance) is shown on the left vertical axis as a function of frequency, and the block force (with an infinite load impedance) is shown on the right vertical axis as a function of frequency. The free velocity exhibits peaks at approximately 500 Hz and 4500 Hz, with the block force exhibiting a peak at approximately 3000 Hz. The modal and distributed modal behaviour is shown.

Figure 6:
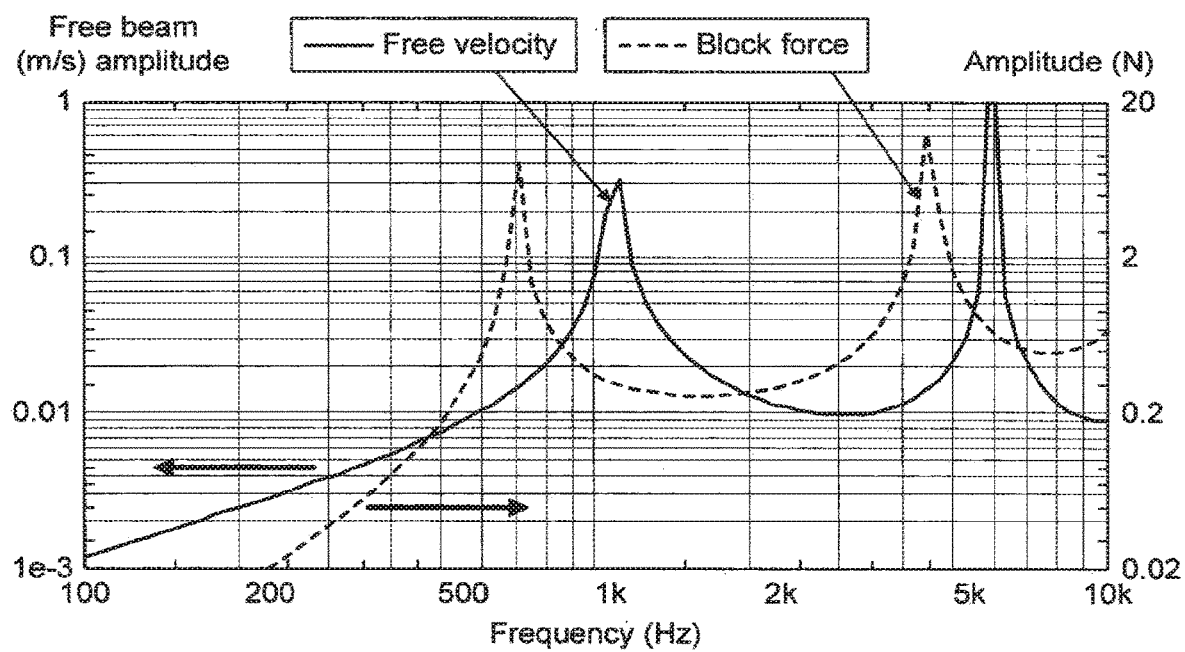
FIG. 6 shows the free velocity (with no load impedance) and block force (with infinite load impedance) as a function frequency for an inertial piezoelectric actuator.

The benchmark performance for an inertial, or free beam, transducer is shown in FIG. 6. The frequency range of operation is shown varying from 100 Hz to 10,000 Hz. The free velocity and the block force are again shown as a function of frequency. The modal and distributed modal behaviour is shown.

It is seen that the inertial transducer has a fall off in frequency at low frequencies. The inertial transducer, in comparison to the simply supported transducer, exhibits reduced free velocity and block force at low frequencies, but an increased free velocity and block force at higher frequencies.

In some situations it would be an ideal to have a transducer that operates effectively in a simply supported mode at low frequencies, and effectively in an inertial mode at high frequencies. An aspect of the present invention operates with this functionality, as discussed below.

FIGS. 5 and 6 represent the benchmark performance for simply supported and inertial transducers, however in operation transducers are used to drive finite load impedances, rather than zero or infinite impedances.

Figure 7:
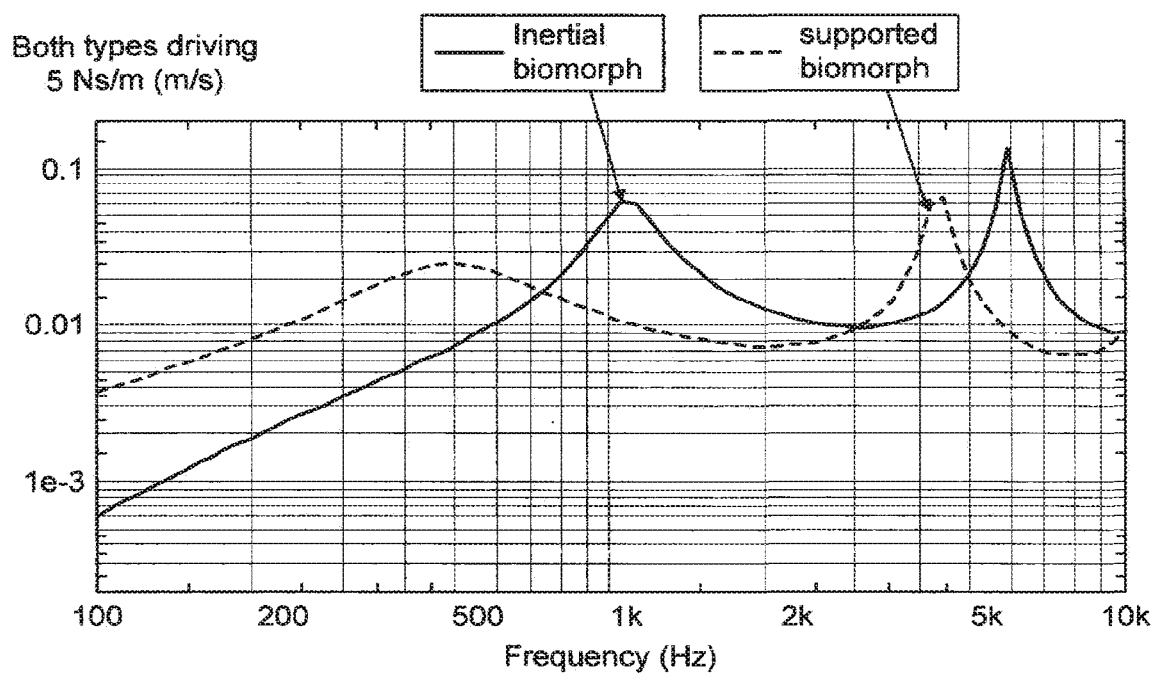
FIG. 7 shows the velocity as a function of frequency for both an unmodified simply supported and unmodified inertial piezoelectric actuator when driving a load impedance of 5 Ns/m in each case.

Transducers driving finite impedances are shown in FIG. 7, where an unmodified inertial transducer and unmodified simply supported transducer are driving a load impedance of 5 Ns/m, and where the velocity of a resonant element of the transducer is shown as a function of frequency. This clearly shows that the simply supported transducer has enhanced output over that for the inertial transducer at low frequencies, with the converse applying at high frequencies.

In FIG. 7 the piezoelectric element for both the unmodified simply supported and unmodified inertial transducer is a bimorph resonant element, meaning that the piezoelectric resonant element is formed from 2 layers of piezoelectric material and can bend in opposite directions.

Figure 8:
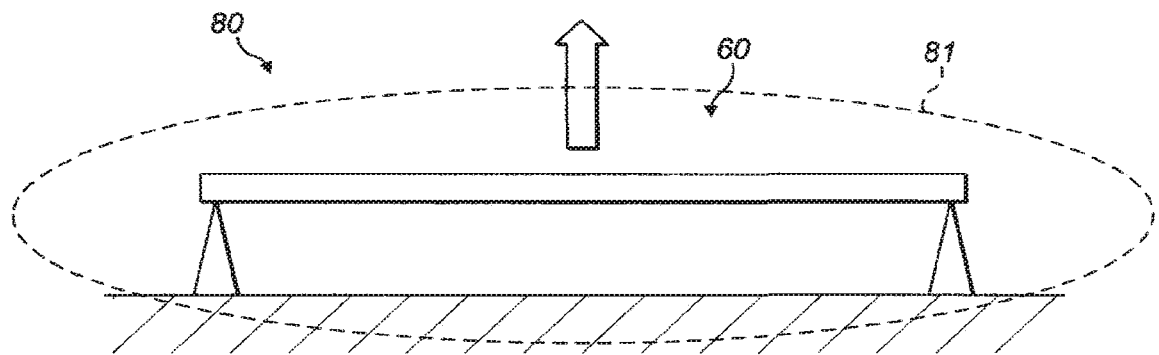
FIG. 8 shows a schematic diagram of a simply supported piezoelectric actuator modified with impedance matching means.

FIG. 8 shows a representation of a modified simply supported piezoelectric actuator or transducer 80 according to an aspect of the invention. An unmodified simply supported piezoelectric actuator 60, has been modified through the use of impedance matching means 81. The use of impedance matching means 81 could be the application of an additional component or components to the simply supported piezoelectric actuator 60. The use of impedance matching means 81 could be the substitution of a component part or parts of the simply supported piezoelectric actuator 60 with other component parts.

Figure 9:
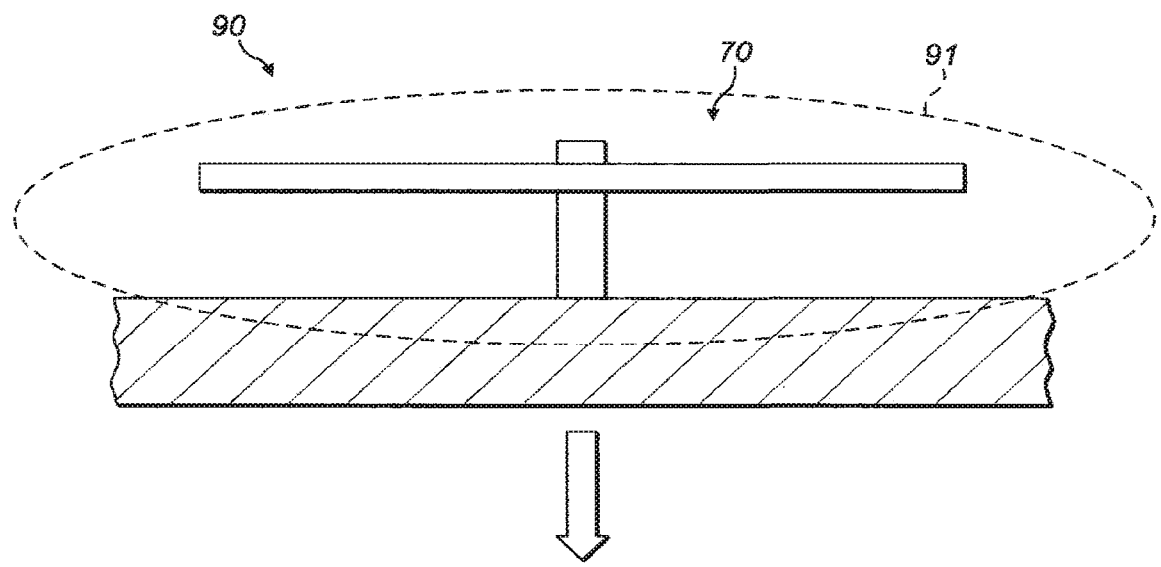
FIG. 9 shows a schematic diagram of an inertial piezoelectric actuator modified with impedance matching means.

FIG. 9 shows a representation of a modified inertial piezoelectric actuator or transducer 90 according to an aspect of the invention. An unmodified inertial piezoelectric actuator 70, has been modified through the use of impedance matching means 91. The use of impedance matching means 91 could be the application of an additional component or components to the inertial piezoelectric actuator 70. The use of impedance matching means 91 could be the substitution of a component part or parts of the inertial piezoelectric actuator 70 with other component parts.

As discussed above there are problems relating to the use of a transducer to drive a load, because the transducer and load impedances may exhibit a mismatch over the frequency range of interest leading to a reduced power transfer, velocity or force characteristic of the transducer. This is because the impedance of the transducer over the frequency range of interest could be different to, and is likely to be different to, the impedance of the load over the frequency range of interest. This situation can necessarily arise because the load to be driven could have a set impedance or an impedance over a fixed range, for example if a transducer was coupled to the pinna of a person's ear and was being used to excite acoustic vibrations in the pinna to couple sound to the ear in a headphone embodiment. Furthermore, the transducer may need to exhibit certain characteristics which leads to the transducer having a certain impedance or range of impedances over the frequency range of operation. These two aspects then mean that there is an impedance mismatch between the transducer and load leading to a reduction in power transfer, velocity or force coupling to the load from the transducer.

Therefore, according to an aspect of the invention there is provided an impedance matching means. Impedance matching does not mean that the impedance of the transducer and the impedance of the load are made to be equal over the frequency range of operation or indeed equal over any frequency over the frequency range of operation. Impedance matching refers to a modification of the impedance of the transducer in order that the operation of the transducer over the frequency range of operation is improved, through there being less of an impedance mismatch over the frequency range of operation.

The impedance matching means is a means to modify the impedance of the transducer, in order to improve the coupling of power, force or velocity from the transducer to the load.

Use of the impedance matching means according to an aspect of the present invention can be thought of as the provision of another degree of freedom within the mechanical impedance space comprising the mechanical impedance of an unmodified transducer and the mechanical of the load, that allows for the designer/engineer of a transducer to drive a load to design a more optimum or optimum transducer to load driving system.

The impedance matching means according to an aspect of the present invention comprises an overmould, for example in the form of a layer, arranged to surround at least part of the piezoelectric device of a transducer.

The impedance matching means according to an aspect of the present invention comprises a soft elastomer that covers at least part of the piezoelectric device. The soft elastomer may be characterised by a Shore A hardness up to 60.

The impedance matching means according to an aspect of the present invention comprises a hard elastomer that covers at least part of the piezoelectric device. The hard elastomer may be characterised by a Shore A hardness up to 90.

The impedance matching means according to an aspect of the present invention comprises a hard polymer that covers at least part of the piezoelectric device. The hard polymer may be characterised by a Shore A hardness up to 100, however typically Shore A hardness applies up to a maximum of 90 and therefore the hard polymer may be characterised by an equivalent Shore D hardness up to 150, but which may typically be up to 100.

The applicant has conducted research that has established that care is needed in the application of the impedance matching overmould, because operation of the transducer can be detrimentally affected.

Figure 10:
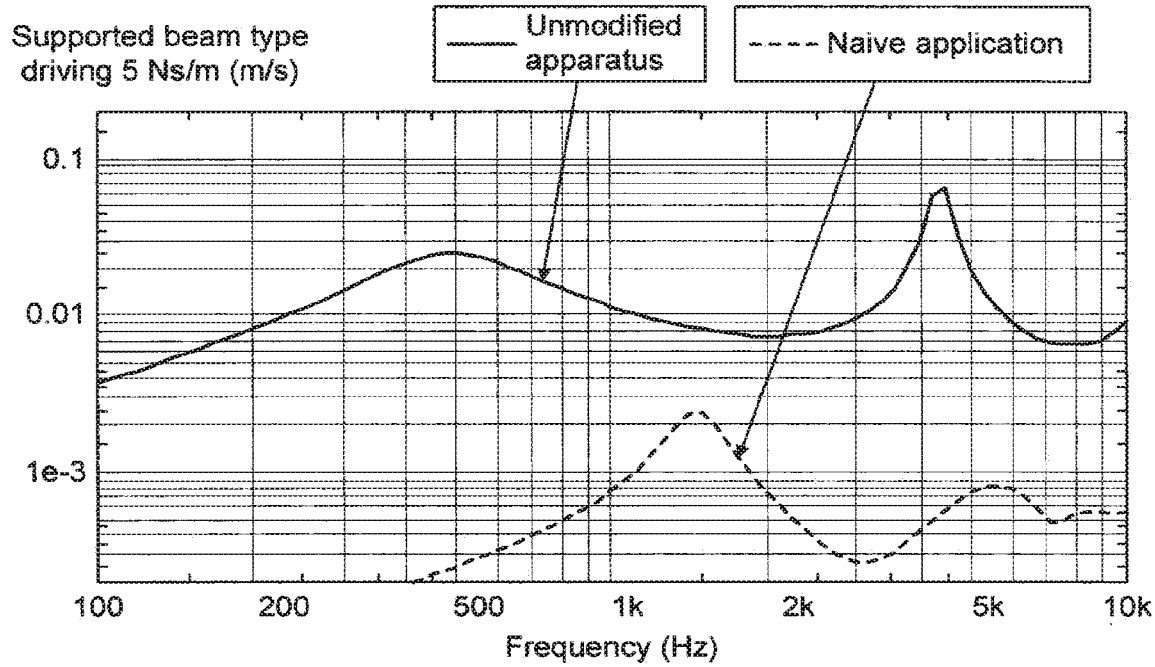
FIG. 10 shows the velocity as a function of frequency for both the simply supported piezoelectric actuator as shown in FIG. 7 and a non-optimised modified simply supported piezoelectric actuator driving a load impedance of 5 Ns/m in each case.
Figure 11:
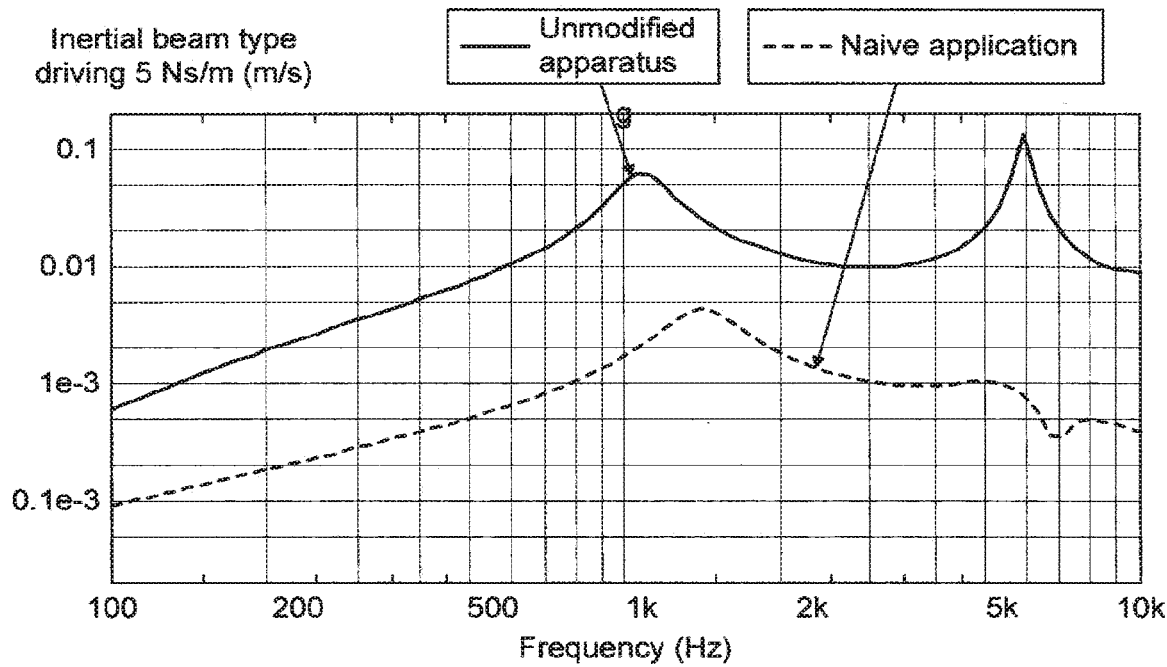
FIG. 11 shows the velocity as a function of frequency for both the inertial piezoelectric actuator as shown in FIG. 7 and a non-optimised modified inertial piezoelectric actuator driving a load impedance of 5 Ns/m in each case.

This is shown in FIG. 10 where the velocity of the resonant element of an unmodified simply supported piezoelectric actuator and an incorrectly modified simply supported piezoelectric actuator is shown as a function of frequency when driving a load impedance of 5 Ns/m and in FIG. 11 where the velocity of the resonant element of an unmodified inertial piezoelectric actuator and an incorrectly modified inertial piezoelectric actuator is shown as a function of frequency when driving a load impedance of 5 Ns/m.

The unmodified imply supported piezoelectric actuator and unmodified inertial piezoelectric actuator shown in FIGS. 10 and 11 have the velocity characteristic of the unmodified transducers as shown in FIG. 7. Incorrect modification means that the overmould layer has been incorrectly applied, and in the cases shown for the simply supported piezoelectric actuator and inertial piezoelectric actuator are representative of an overmould layer that may be applied if the actuators were to be simply made more robust, for example more able to withstand vibrations or being dropped, without optimising the overmould for impedance matching purposes.

In FIG. 10 operation of the simply supported piezoelectric actuator is shown where an overmould layer comprising a non optimised soft elastomer layer has been applied around the resonant element of the piezoelectric device, and an overmould layer comprising a non-optimised hard elastomer has been applied to the resonant piezoelectric to form the simple supports. The non-optimised case has been referred to as a naïve application, and as shown the performance of the piezoelectric actuator has been severely affected.

In FIG. 11 operation of the inertial piezoelectric actuator is shown where an overmould layer comprising a non optimised soft elastomer layer has been applied around the resonant element of the piezoelectric device, and an overmould layer comprising a non-optimised hard polymer has been applied around to the resonant piezoelectric to form the coupler between the piezoelectric element and the load. The non-optimised case has again been referred to as a naïve application, and as shown the performance of the piezoelectric actuator has been severely affected.

According to an aspect of the present invention the applicant's research has established that the parameters of the overmould layer arranged to surround at least part of the piezoelectric device need to be selected to provide the required impedance matching between the transducer and the load to provide the desired power, velocity and/or force coupling between or from the transducer to the load.

The parameters of the overmould to be selected include: the material, which can be a soft or hard elastomer, a rubber material, a polymer material or any other suitable material; the hardness, stiffness, Young's or shear modulus or other material characteristics of the material forming the overmould layer; the thickness of the overmould, especially if the overmould is in the form of a layer, which could vary in thickness at different positions around the piezoelectric layer; and the form of the overmould. The form of the overmould layer refers to: a soft elastomer that surrounds the, or part of the, piezoelectric device: a hard elastomer that surrounds the, or part of the, piezoelectric device and that may provide the simple support means or inertial support means or coupling means between the piezoelectric device and the load, a soft or hard polymer that surrounds the, or part of the, piezoelectric device and that may provide the simple support means or inertial support means or coupling means between the piezoelectric device and the load. The foregoing is not an exhaustive list of the parameters that may be selected in order to achieve desired impedance matching.

In the foregoing and in the following the impedance matching means is referred to as an "overmould" because it is particularly convenient for it to be formed by moulding, e.g. injection moulding. However the general principles of choosing suitable design parameters are not limited to moulded impedance matching means and this disclosure is not to be interpreted as limited to moulded impedance matching means.

To provide a desired power, force and/or velocity coupling from a transducer to a load using an overmould, e.g. overmould layer, to provide impedance matching may lead to an optimised design that comprises a different piezoelectric resonator, different mounting configuration or other different physical aspects to a transducer without an overmould impedance matching means. The overmould impedance matching means in addition to providing impedance matching can provide support or resilience to a piezoelectric element or resonator, meaning that the optimised transducer design with an overmould may not be operable if the overmould was removed and the piezoelectric resonator design did not change. Use of an overmould may allow for the use of an optimised design of piezoelectric resonator that would be fragile, or otherwise not be able to operate or be liable to failure if the overmould was removed.

Figure 12:
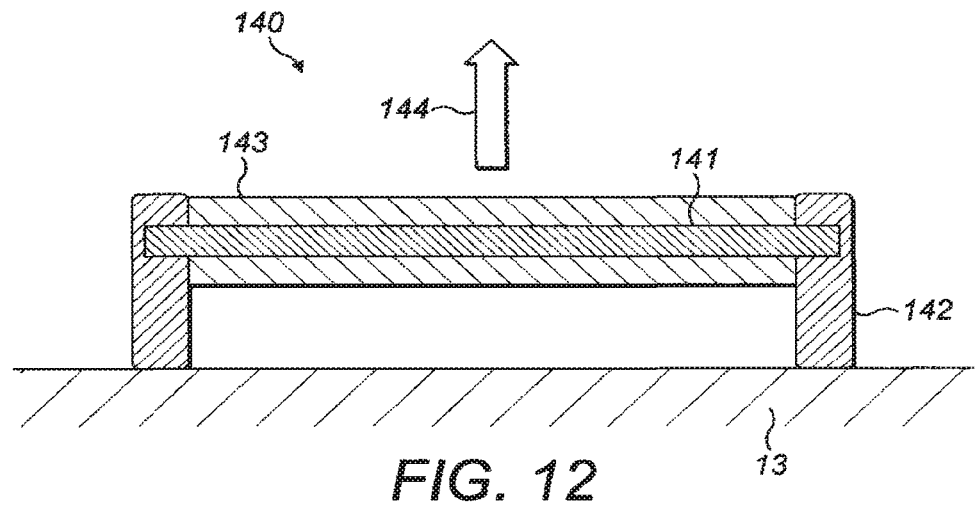
FIG. 12 shows a schematic of an optimised modified simply supported piezoelectric actuator with soft and hard elastomer/polymer impedance matching means.

In FIG. 12 an example of an optimised simply supported piezoelectric actuator 140 according to an aspect of the present invention is shown in cross section, with overmould impedance matching means. A generally rectangular piezoelectric bimorph 141 in the form of a beam is provided with impedance matching means in the form of a layer of soft elastomer 143 on each of its major surfaces. In one example the elastomer may have a Shore hardness of A30. A suitable thickness for the soft elastomer 143 is 0.5 mm. The piezoelectric bimorph 141 is provided with additional impedance matching means in the form of elastomeric supports 142. Each of the supports may comprise a hard elastomer for example of Shore hardness A70. Two supports are provided, positioned at either end of the piezoelectric bimorph or resonant element 141, forming the simple supports or feet for the piezoelectric actuator. It will be noted that in the illustrated example, the layers of elastomer 143 extend over the entire surfaces of the bimorph up to the supports 142. The simply supported piezoelectric actuator 140 is mounted to a mechanical ground 13 through the hard elastomer supports or feet 142, which may have a thickness of 1 mm. The end or periphery of the piezoelectric element 141 terminates within the hard elastomer feet 142. The feet 142 may be configured to grip a part of the periphery of the piezoelectric element 141. The feet may extend along the full width of the element 141. Power 144 is coupled through the soft elastomer layer to a load, not shown but which could for example be the pinna of an ear or a panel of a loudspeaker. The layer of soft elastomer 143 and the hard elastomer feet 142 together form an overmould impedance matching means.

Figure 13:
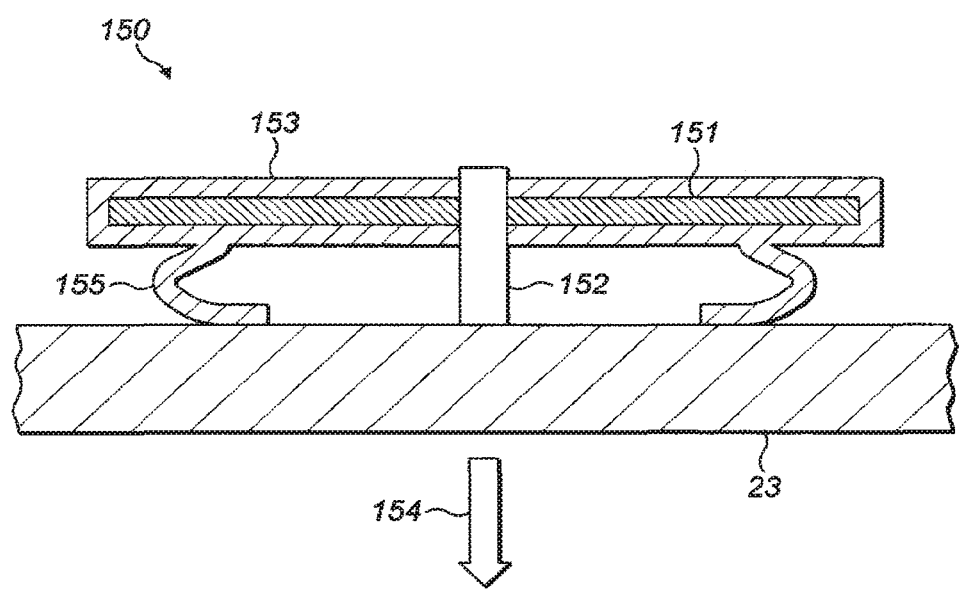
FIG. 13 shows a schematic of an optimised modified inertial piezoelectric actuator with soft and hard elastomer/polymer impedance matching means.

In FIG. 13 an example of an optimised inertial piezoelectric actuator 150 according to an aspect of the present invention is shown, with alternative overmould impedance matching means. A generally planar piezoelectric bimorph 151 in the form of a beam is surrounded by an overmould impedance matching means in the form of a layer of soft elastomer 153 completely enveloping the bimorph 151. A suitable Shore hardness for the elastomer is A20. A suitable thickness of the soft elastomer 153 is 0.5 mm. The piezoelectric bimorph 151 is also provided with impedance matching means positioned at the centre of the piezoelectric bimorph or resonant element 151, forming a coupler 152 from the transducer to the load 23 for the piezoelectric actuator. The coupler 152 may be in the form of a hard polymer coupler 152 of which a suitable Shore hardness is A or D100. The coupler 152 may be shaped to surround a central portion of the bimorph 151. The inertial piezoelectric actuator 150 is mounted to the load to be driven 23 through the coupler 152. The soft elastomer of the layer 153 is formed into feet 155 extending between the piezoelectric bimorph 151 and the load 23. In the illustrated example two feet are provided, one at each end of the bimorph, for example positioned $\frac{1}{3}^{rd}$ of the way from the end of the piezoelectric bimorph 151. The feet 155 act as 'catchers' and act to support the piezoelectric resonator with the soft elastomer layer 153. The feet 155 are designed to have a geometry that exhibits flexibility due to the design, allowing the piezoelectric element 151 to vibrate without being restrained or unnecessarily restrained. This allows the optimised design to operate, as discussed above. The position $\frac{1}{3}^{rd}$ from the end of the piezoelectric element is an optimum position for feet 155 as would be appreciated by the person skilled in the art from an analysis of the angular momentum of the system. Power 154 is coupled through the hard polymer coupler 152 to a load 23, which could for example be a panel of a loudspeaker.

In the examples of FIGS. 12 and 13 the piezoelectric elements are generally rectangular but they are not limited to such shapes.

Figure 14:
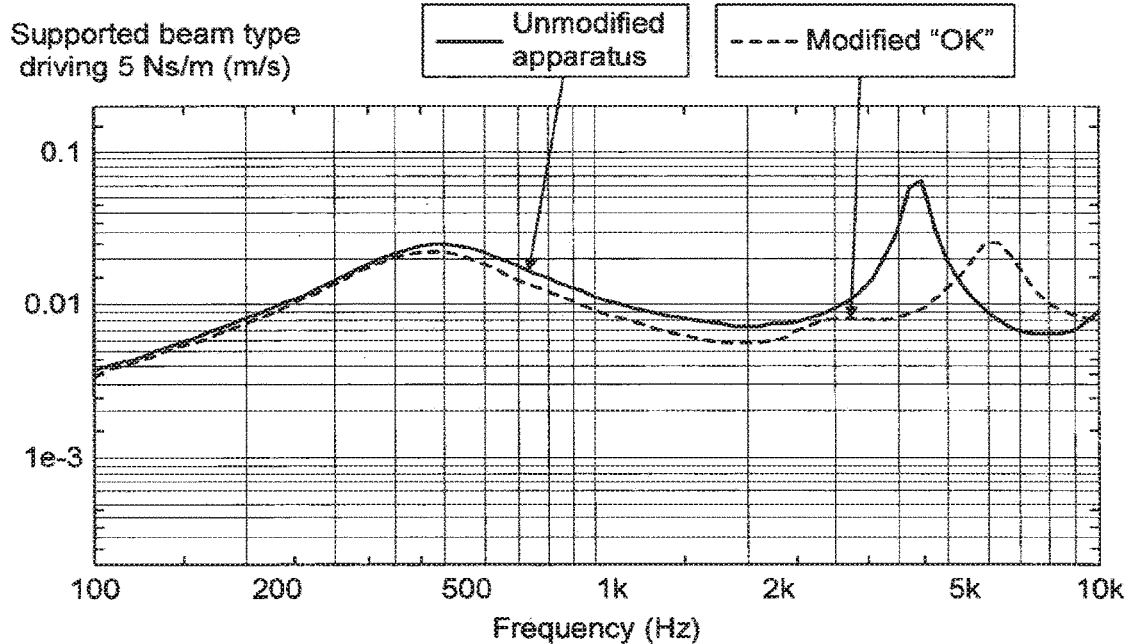
FIG. 14 shows the velocity as a function of frequency for both the simply supported piezoelectric actuator as shown in FIG. 7 and the optimised modified simply supported piezoelectric actuator shown in FIG. 12 driving a load impedance of 5 Ns/m in each case.

In FIG. 14 the velocity as a function of frequency of the optimised simply supported piezoelectric actuator of FIG. 12 with an overmould layer is shown alongside the unmodified piezoelectric actuator velocity characteristic as shown in FIG. 7. The performance of the optimised piezoelectric actuator is significantly better than the non-optimised piezoelectric actuator as shown in FIG. 10, and is tending toward that of the unmodified piezoelectric actuator. The velocity characteristic is shown, and is tending toward that for the unmodified and at some frequencies has improved upon that of the unmodified, however as discussed above the parameters of the impedance matching means have been selected to provide the required impedance matching between the transducer and the load and accordingly the coupling of power from the transducer to the load will now tend toward that desired or required.

Figure 15:
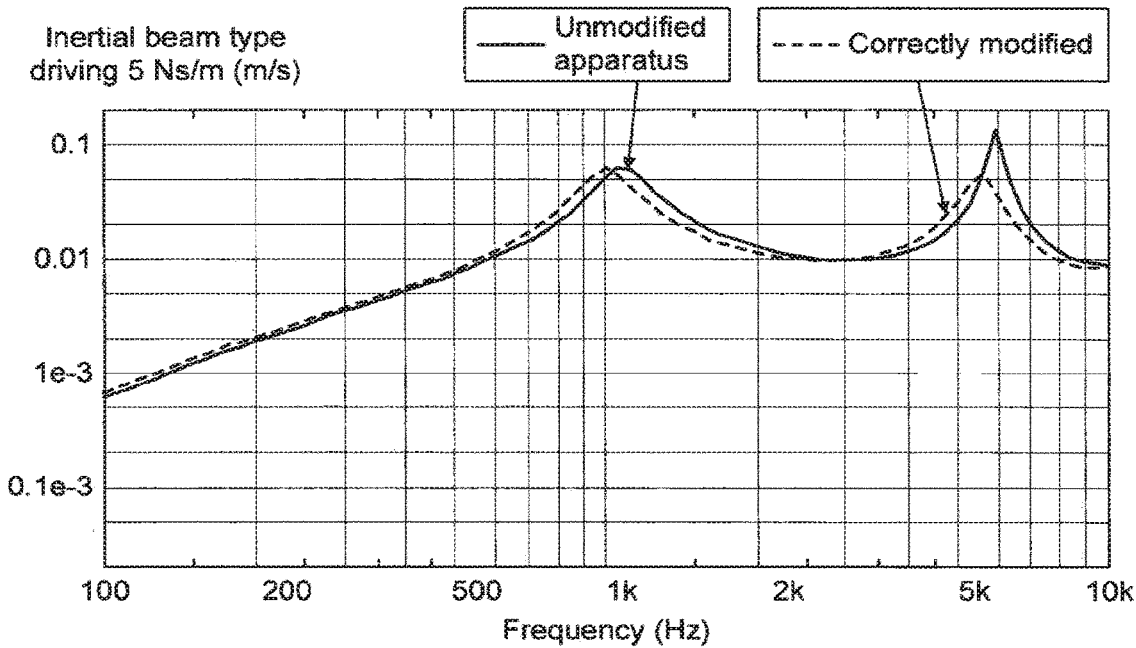
FIG. 15 shows the velocity as a function of frequency for both the inertial piezoelectric actuator as shown in FIG. 7 and the optimised modified inertial piezoelectric actuator shown in FIG. 13 driving a matched load impedance of 5 Ns/m in each case.

In FIG. 15 the velocity as a function of frequency of the optimised inertial piezoelectric actuator of FIG. 13 with an overmould layer is shown alongside the unmodified piezoelectric actuator velocity characteristic as shown in FIG. 7. The performance of the optimised piezoelectric actuator is significantly better than the non-optimised piezoelectric actuator as shown in FIG. 11, and is tending toward that of the unmodified piezoelectric actuator and indeed improves upon the unmodified at certain frequencies. The velocity characteristic is shown, and is tending toward that for the unmodified piezoelectric actuator and indeed at certain frequencies has improved upon that of the unmodified, however as discussed above the parameters of the impedance matching means have been selected to provide the required impedance matching between the transducer and the load and accordingly the coupling of power from the transducer to the load will tend toward that desired or required.

Figure 1:
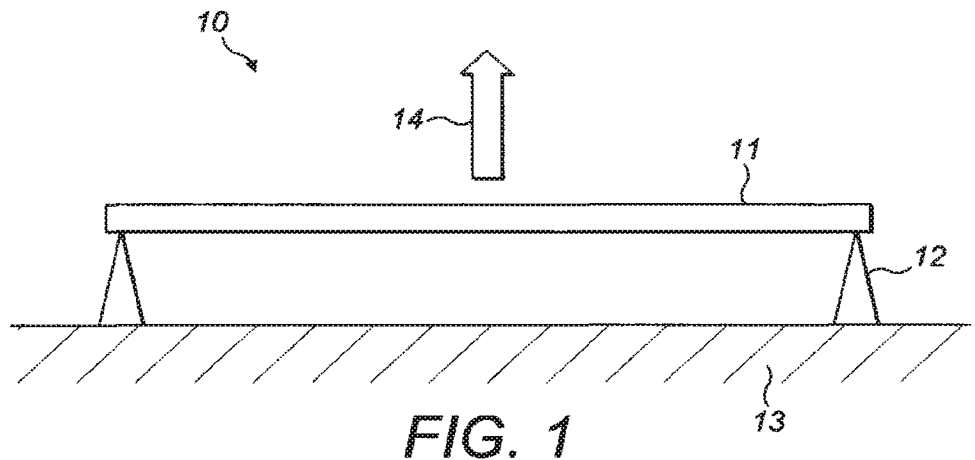
FIG. 1 shows a schematic diagram of an ideal simply supported piezoelectric actuator.
Figure 2:
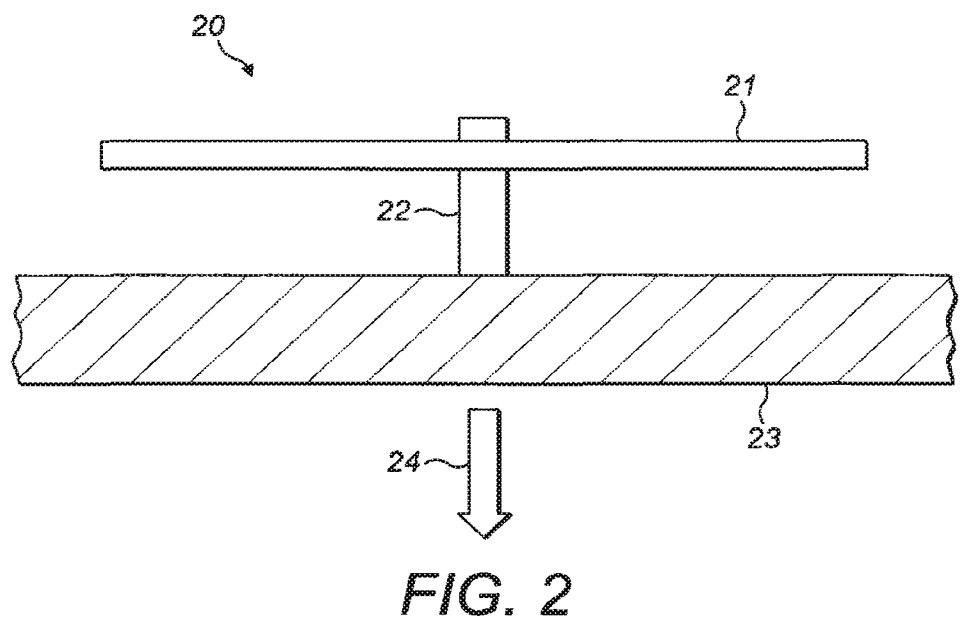
FIG. 2 shows a schematic diagram of an ideal inertial piezoelectric actuator.
Figure 3:
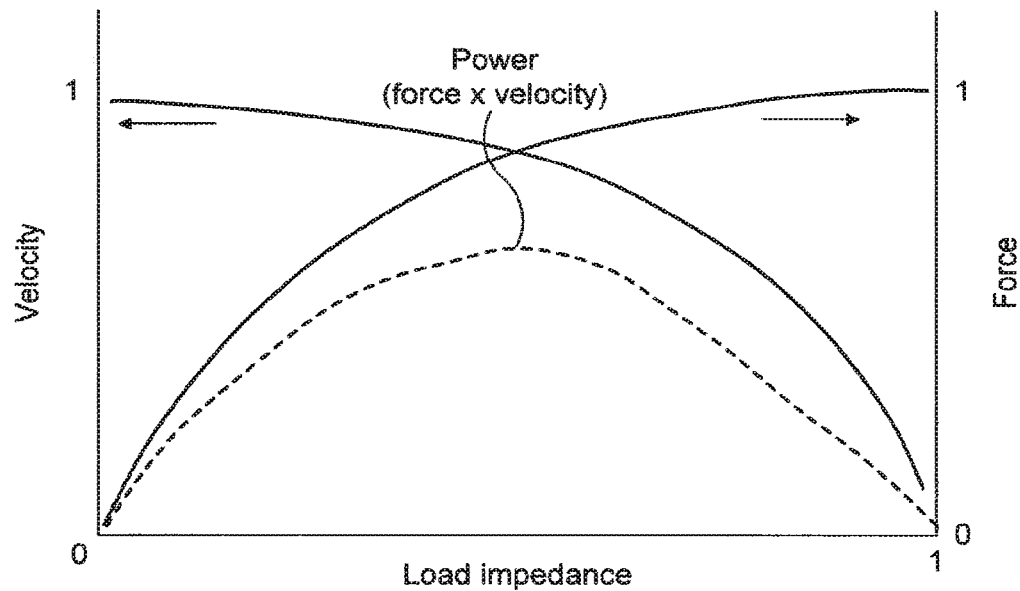
FIG. 3 shows a representation of the velocity and force of a representative transducer as shown in either FIG. 1 or FIG. 2 as a function of load impedance, with the resultant power also shown.
Figure 4:
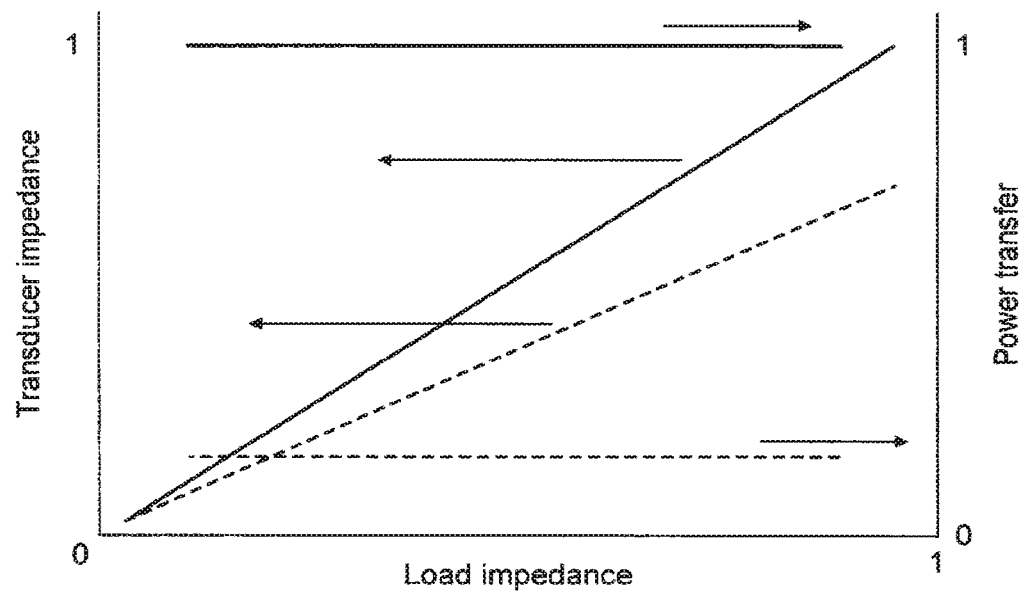
FIG. 4 shows a representation of the power transfer between a transducer characterised by a transducer impedance and a load characterised by a load impedance, showing a representation of load impedance and transducer impedance mismatch
Figure 16:
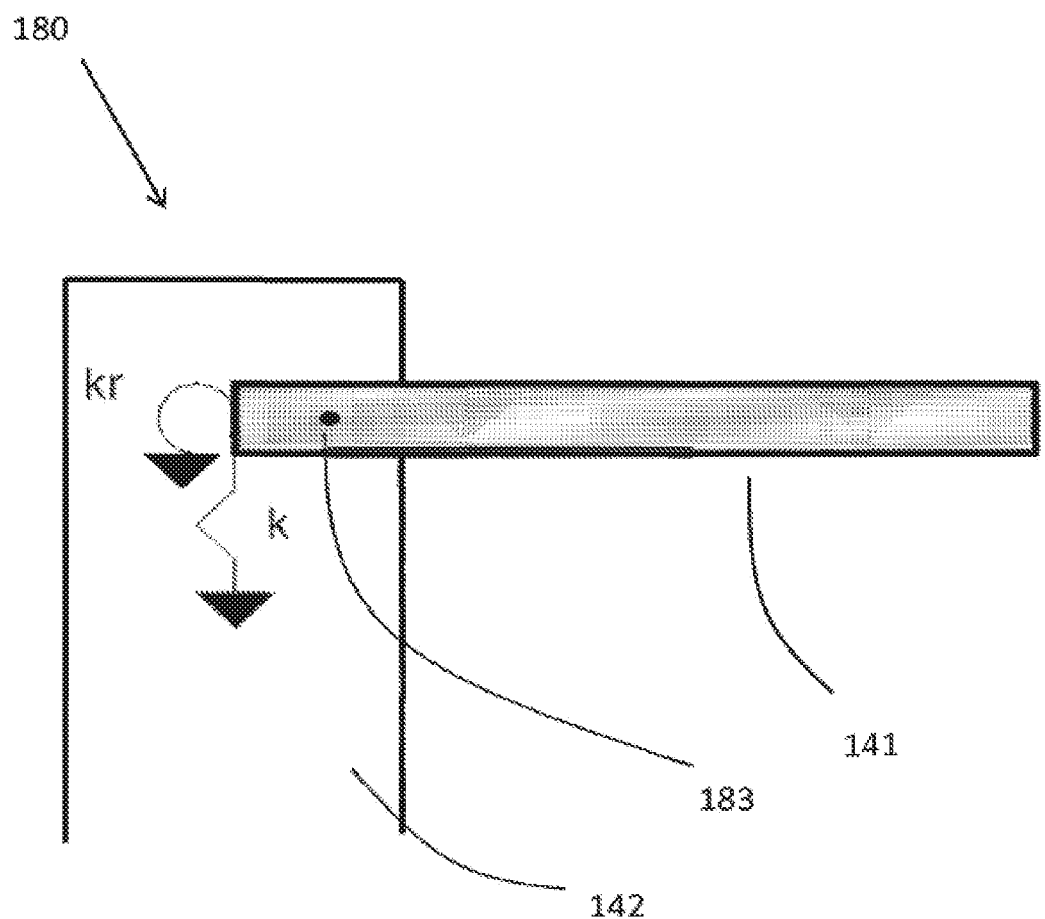
FIG. 16 shows a schematic diagram of one example of the end mounting for the simply supported piezoelectric actuator shown in FIG. 12.

In FIG. 16 a schematic diagram of an example of an end mounting for a simply supported piezoelectric actuator 180 according to an aspect of the invention is shown, which shows one end of the simple support of the piezoelectric actuator as shown in FIG. 12. The simple support means comprises the hard elastomer foot 142, within which is mounted the end or periphery of the piezoelectric resonant element 141. A suitable Shore hardness for the foot 142 is 70. A translational stiffness k and a rotational stiffness kr for the element 141 are indicated. In a simply supported piezoelectric actuator, as discussed above and shown in FIG. 1, the ideal situations for the end of the piezoelectric element 141 to be constrained from translating, i.e., the piezoelectric element 141 as shown in FIG. 16 should be constrained from moving in the direction of the extent of the foot as shown. However, the piezoelectric beam should be free to rotate about a point situated at the end or periphery of the beam or element 141.

This means that the translational stiffness k should be very high and the rotational stiffness kr should be very low. As the value of k is reduced from a very high level the ends of the piezoelectric beam 141 become able to translate which means that the mounting tends away from an ideal simple support. As the value of kr increases from a low level, the force output from the piezoelectric actuator effectively becomes short circuited by the feet 142 and the force output is coupled through the feet. This means that for the simple support example shown in FIG. 16 and shown in FIG. 12 the force is coupled through the feet 142 to the mechanical ground 13. For real materials k is not infinite and kr is not zero, which means that the example of an optimised simple support end termination as shown in FIG. 16 is not an ideal simple support mount. This means that the end of the piezoelectric element 141 is able to translate, and is not able to rotate as freely as for an ideal simple support configuration, and a result of this is that the position about the which the piezoelectric element 141 rotates is moved inboard from the end of element, where the rotation position is shown in FIG. 16 as position 183. Additionally, the finite length of the "foot", that is the finite length of the end part or periphery of the piezoelectric resonant element 141 within the hard elastomer foot 142, effectively shifts the rotation point from the end of the beam to the mid-point of foot. This is a parameter that can be varied for improved impedance matching.

Typically, with simple materials, k and kr are inextricably linked, and therefore it is not possible to achieve the ideal simple supported mounting configuration. The end mounting configuration, shown in FIG. 1 for the ideal simply supported case where simple support mounts 12 are provided to give the ideal simple support, or end mounting means providing one example of an optimised simple support case as shown in FIGS. 12 and 16 can be considered to form a boundary condition for the periphery or end of the piezoelectric device. The parameters of the mounting means can then be selected to provide a required boundary condition for the periphery(s) or end(s) of the piezoelectric device whereby the desired power, force or velocity coupling between the transducer and load is provided.

The parameters of the mounting means to be selected include: the material, which can be a soft or hard elastomer, a rubber material, a polymer material or any other suitable material; the hardness, stiffness, Young's or shear modulus or other material characteristics of the material forming the mounting means; the thickness and geometry of the mounting means, and any means for artificially constraining the material forming the mounting means to effectively alter its material characteristics. The foregoing is not an exhaustive list of the parameters that may be selected in order to achieve desired impedance matching.

It is possible, however, to combine engineering and materials science to ameliorate the negative side-effects of real materials with non-infinite translational stiffness and non-zero rotational stiffness. For examples rubbers are characterised by a low shear stiffness, but a high bulk modulus (they are almost incompressible)—typical values are tabulated below. In each case, Poisson's ratio is nearly equal to ½, so Young's modulus is nearly 3 times the shear modulus, and the bulk modulus is typically over 1000 times the shear modulus.

| Material 'SH-A' | Shear (G)/MPa | Bulk (K)/GPa | Young's (E)/MPa |
|---|---|---|---|
| 20 | 0.25 | 0.98 | 0.75 |
| 30 | 0.30 | 1.0 | 0.90 |
| 40 | 0.47 | 1.0 | 1.41 |
| 50 | 0.67 | 1.05 | 2.01 |
| 60 | 1.25 | 1.15 | 3.75 |
| 70 | 2.05 | 1.25 | 6.15 |

Figure 17:
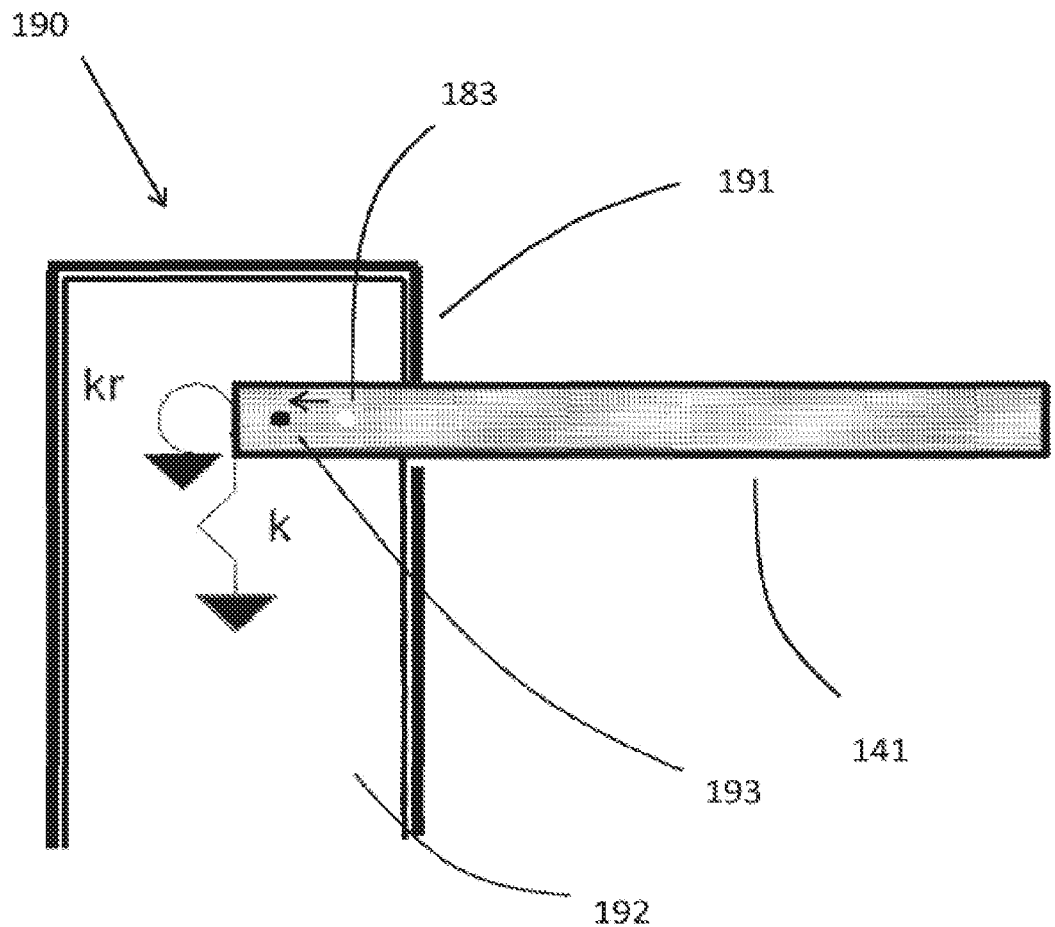
FIG. 17 shows a schematic diagram of a further example of the end mounting for the simply supported piezoelectric actuator shown in FIG. 12.

Therefore a further aspect of the invention is shown in FIG. 17, showing an example of an end termination of a simply supported piezoelectric actuator, forming a simple support boundary condition. In FIG. 17 the piezoelectric element 141 is mounted so as to partially extend into a hard elastomer foot 192. The hard elastomer foot 192 is provided with restraining or constricting means 191. The restraining means 191 forms a mechanical restraint around the outer periphery of the foot 192, and inhibits the foot 192 from changing its volume. The restraining means is formed from a non-compliant layer, or applique, that surrounds substantially all of the free surface of the foot 192. The non-compliant restraining means 191 is formed from a hard polymer or other appropriate material. Preferably the elasticity of the restraining means or casing is lower than that of the foot 192 or other mount.

By "boxing-in", or restraining, the hard elastomer foot 192 (which may be made of rubber) on the sides, and or top,—the material is being inhibited from changing its volume; the high K values shown in the figure create a high value for k. The non-volume-changing rocking motion of the end of the piezoelectric beam 141 activates the low shear modulus values, creating a low value for rotational stiffness kr. This means that by boxing in the hard elastomer foot 192, the shore hardness of the foot can be reduced from that for an unrestrained foot. In FIG. 17, the hard elastomer foot now has a Shore A hardness of 40 as opposed to a Shore A hardness of 70 for an unrestrained foot. This has moved the position around which the end of the piezoelectric element 141 rotates from position 183 to position 193, which means that the rotation position has moved toward the end of the piezoelectric element. The simple support boundary condition has become more like an ideal simple support arrangement.

Figure 18:
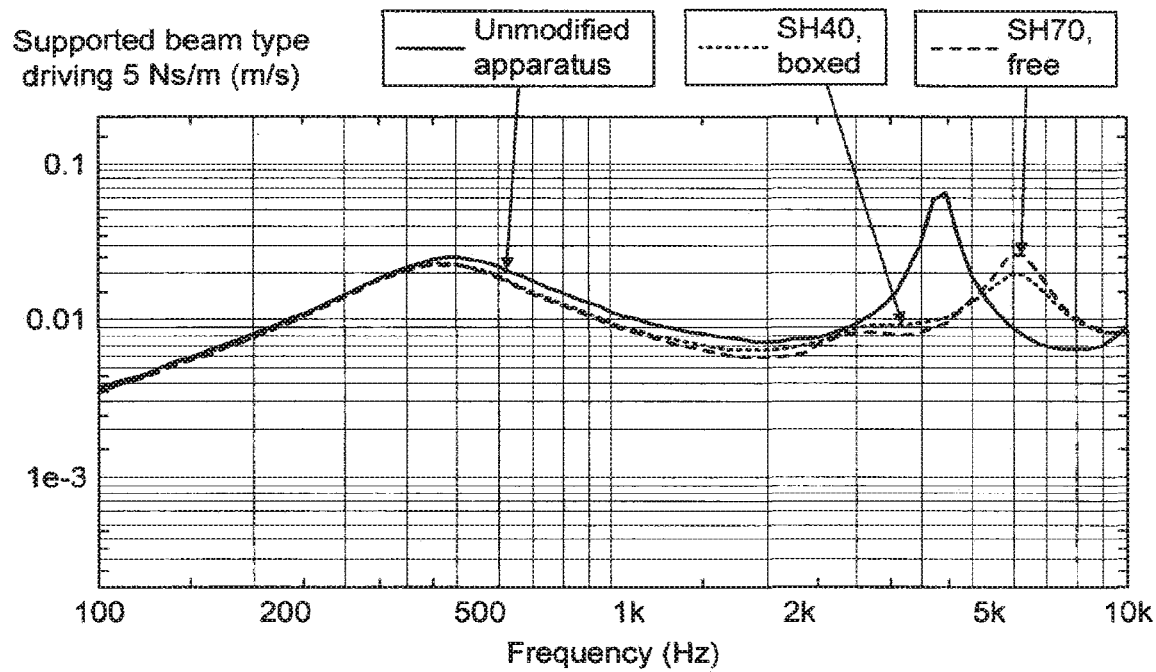
FIG. 18 shows the velocity as a function of frequency for the simply supported piezoelectric actuator as shown in FIG. 7 and the optimised modified simply supported piezoelectric actuators shown in FIGS. 16 and 17 driving a load impedance of 5 Ns/m in each case.

The result of restraining the hard elastomer foot as shown in FIG. 17 is shown in FIG. 18 where the velocity as a function of frequency for the simply supported piezoelectric actuator with an optimised modified unrestrained hard elastomer foot, for the simply supported piezoelectric actuator with an optimised restrained elastomer foot, and for the unmodified simply supported piezoelectric actuator is shown. By changing the material of the hard elastomer foot from Shore hardness A70 to 40, and boxing-in the sides, an improvement of between 0.1 and 0.9 dB in the response level is obtained in this example, where the improvement may be greater or less than this. The boxing-in or constraining of the mount or foot may be around the sides only but preferably also covers the top as shown.

Figure 19:
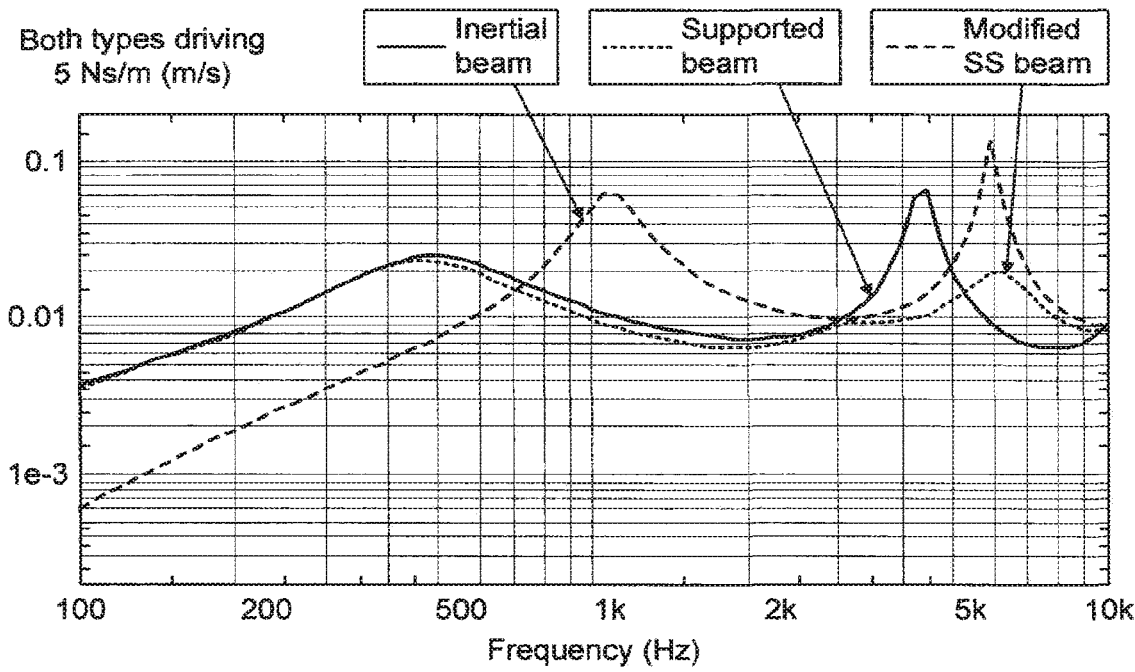
FIG. 19 shows the velocity as a function of frequency for the simply supported and inertial piezoelectric actuators as shown in FIG. 7 and the optimised modified simply supported piezoelectric actuator as shown in FIG. 17 driving a matched load impedance of 5 Ns/m in each case.

According to a further aspect of the present invention the parameters of the mounting means are selected to provide a required boundary condition that allows the operation of the simply supported transducer to operate in a simply supported mode at low frequencies and effectively in an inertial mode at high frequencies. This is shown in FIG. 19 which shows the velocity as a function of frequency for the simply supported piezoelectric actuator with an optimised modified restrained hard elastomer foot, for the unmodified simply supported piezoelectric actuator and for the unmodified inertial piezoelectric actuator. As shown in the velocity profile the simply supported piezoelectric actuator with an optimised modified restrained foot operates as in a simply supported mode at low frequencies, and as shown in this example at frequencies above 2-3000 Hz, it begins to operate in an inertial mode. This is shown by the piezoelectric actuator with a restrained foot exhibiting a modal behaviour similar to that of the inertial piezoelectric actuator at high frequencies; both the simply supported piezoelectric actuator with an optimised restraining foot and the unmodified inertial piezoelectric actuator have a mode at ~6000 Hz.

This means that according to a further aspect of the present invention by deliberate choice of the stiffness k, one could tune an additional resonance to boost performance around a particular frequency region. An interesting side-effect of this adjustment is that at frequencies above this new resonance, the ends of the beam become effectively free, so the operation should become more like that of the inertial piezoelectric actuator at higher frequencies.

The hard elastomer feet 142 as shown in FIG. 16 may have a Shore A hardness of 70, but this could be up to 90. In one example for rubber, as shown in the above table, the Shear modulus for the hard elastomer may be 2.05 MPa.

As discussed above, mounting of the piezoelectric element in the hard elastomer foot leads to movement of the effective rotational axis of the simply supported element inboard from the end or periphery of the element. To address the side-effect of effectively shortening the beam by moving the rotation point in-bound, the piezoelectric bimorph may incorporate a metallic central vane, extended out from the resonant elements, and the hard elastomer feet can be moulded around the vane. Care must however be taken to ensure that the rotation of the end of the piezoelectric element is not constrained. This means that the properties/parameters of the mounting means can be selected to provide the required boundary conditions, to provide the required or desired coupling of power from the transducer to the load. The central vane may be formed from a material other than metal in some examples.

Figure 20:
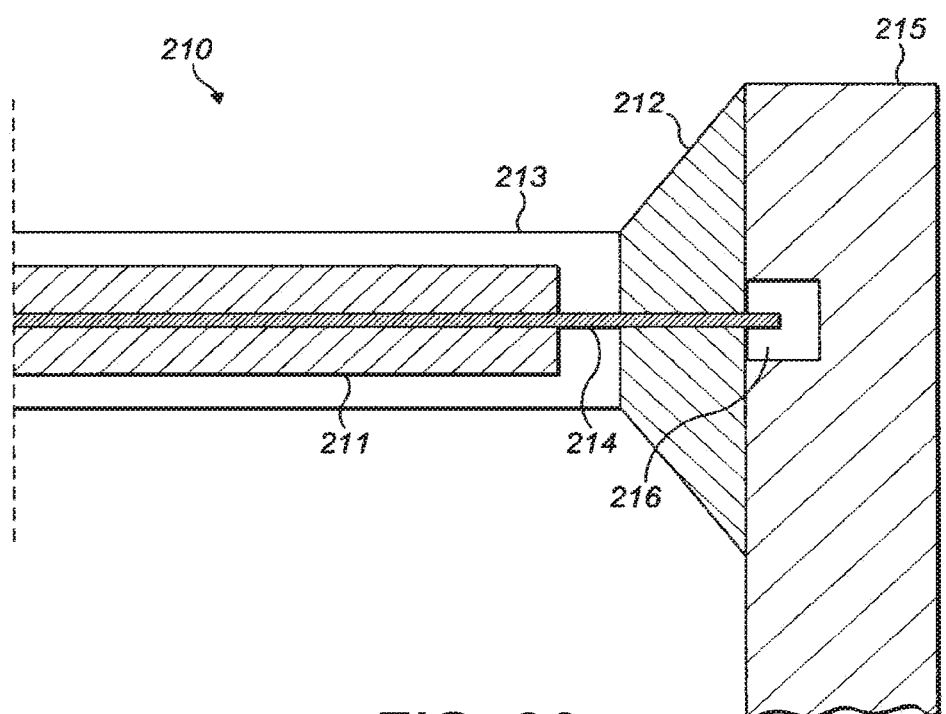
FIG. 20 shows a schematic diagram of a further example of the end mounting for the simply supported piezoelectric actuator shown in FIG. 12.

This is shown in FIG. 20, which shows the end termination of a simply supported piezoelectric actuator with an extended vane with a hard elastomer around the central vane, and with a soft elastomer overmould over the piezoelectric element. In FIG. 20 the end termination 210 of one end of a simply supported piezoelectric actuator is shown. Piezoelectric bimorph 211 has a central vane 214 extending out from the piezoelectric materials bonded or attached to either side of the vane. The vane 214 extends all the way through a hard elastomer foot 212, of an appropriate Shore A hardness that may be up to 90. The hard elastomer foot is mounted to a support mount 215, which could be mounted to a mechanical ground. The support mount 215 has free space 216 or recess within the part attached to the hard elastomer foot into which the vane 214 extends. The space 216 will modify the characteristics of the hard elastomer foot, and forms one of the parameters that need to be considered when selecting the required parameters for the mounting means as discussed above. The piezoelectric element is also shown with a soft elastomer overmould layer 213.

In other examples of transducer the frequency range of operation may extend below 100 Hz, tending towards 0 Hz, and may extend above 10,000 Hz to 20,000 Hz, 30,000 Hz, 50,000 Hz and above.

In other examples the piezoelectric resonant element may be a unimorph, or a bimorph with a central vane.

In other examples a transducer may be coupled to the panel that forms part of a loudspeaker.

In the examples described and in other examples acoustic vibrations includes vibrations such as pistonic mode vibrations, bending wave vibrations, resonant bending wave vibrations, and other sound or acoustic vibrations known in the art.

In other examples, the impedance matching means may lead to a reduction in performance at some frequencies over the frequency range of operation.

Although the impedance matching means is applied to the transducer to modify the impedance of the transducer, it is clear that the transducer/load system considered as a whole has had its impedance modified and accordingly, the present invention is considered to cover the modification of the impedance of this whole system.

In other examples the overmould layer covers substantially all of the piezoelectric device.

In other examples the overmould layer covers all of the piezoelectric device.

In other examples the overmould layer covers substantially all of the upper and/or lower surfaces of the resonant element or elements of piezoelectric device.

In other examples the overmould layer covers all of the upper and lower surfaces of the resonant element of piezoelectric device.

In other examples the overmould layer has the added advantage over and above that of providing a required impedance matching between the mechanical impedance of the transducer and the mechanical impedance of the load to provide the required or desired power coupling or force coupling or velocity coupling from the transducer to the load.

In other examples of the an optimised simply supported piezoelectric actuator as shown in FIG. 12, the layer of soft elastomer 143 alone forms the overmould layer to provide the impedance matching means.

In other examples of the an optimised simply supported piezoelectric actuator as shown in FIG. 12, the hard elastomer feet 142 alone form the overmould layer to provide the impedance matching means.

In other examples of the an optimised simply supported piezoelectric actuator as shown in FIG. 12, the hard elastomer feet 142 have a different shore A hardness.

In other examples of the an optimised simply supported piezoelectric actuator as shown in FIG. 12, a stub or coupler may be mounted to the piezoelectric resonant element 141, on the side of the piezoelectric element 141 opposite to the mechanical ground. This stub or coupler may be used to couple to the load to be driven, such as a panel of a loudspeaker. Or the stub or coupler may be used to couple to a second piezoelectric element positioned substantially parallel to piezoelectric element 141 in a stacked piezoelectric transducer. In this way there may be more than one additional resonator element making up the piezoelectric actuator transducer, with the overmould layer arranged to surround all or some of this piezoelectric device. The stub or coupler is not shown in FIG. 12, because the exemplar transducer shown in FIG. 12 is coupled to the load through layer 143.

In other examples of the optimised simply supported piezoelectric actuator as shown in FIG. 12, the hard elastomer feet 142 could be coupled to the load to be driven rather than to a mechanical ground.

In other examples of the optimised simply supported piezoelectric actuator as shown in FIG. 12, velocity or force may be coupled to the load, or velocity and force may be coupled to the load, or power, velocity and force may be coupled to the load.

In other examples of the optimised simply supported piezoelectric actuator as shown in FIG. 12, the thickness of the soft elastomer 143 is less than or greater than 0.5 mm, and in other examples the soft elastomer 143 has a Shore A hardness less than or greater than 30.

In other examples of the optimised simply supported piezoelectric actuator as shown in FIG. 12, the thickness of the soft elastomer 143 varies across the piezoelectric bimorph 141. The thickness may be less at the centre of the resonator 141 than at the ends, or the thickness may be greater at the centre than the ends.

In other examples of the optimised simply supported piezoelectric actuator as shown in FIG. 12, the soft elastomer 143 is only applied to one side of the piezoelectric bimorph 141.

In other examples of the optimised simply supported piezoelectric actuator as shown in FIG. 12, the hard elastomer feet 142 have a shore A hardness less than or greater than 70, and may have a thickness less than or greater than 1 mm.

In other examples of the optimised simply supported piezoelectric actuator as shown in FIG. 12, the piezoelectric element 141 extends one quarter of the way through the hard elastomer feet 142, or may extend one half of the way through or three quarters of the way through the hard elastomer feet 142. Other terminating positions are possible.

In other examples of the optimised simply supported piezoelectric actuator as shown in FIG. 12, the piezoelectric element 141 extends all of the way through the hard elastomer feet 142, and the end of the piezoelectric element may be coincident with the outer extent of the hard elastomer feet 142. The piezoelectric bimorph 141 may extend all the way through the hard elastomer feet, and extend 1 mm, 2 mm or 4 mm out of the other side of a hard elastomer foot 142. Other extension distances are possible.

In other examples of the an optimised inertial piezoelectric actuator as shown in FIG. 13, the layer of soft elastomer 153 alone forms the overmould layer to provide the impedance matching means.

In other examples of the an optimised inertial piezoelectric actuator as shown in FIG. 13, the soft elastomer feet 155 alone form the overmould layer to provide the impedance matching means.

In other examples of the optimised inertial piezoelectric actuator as shown in FIG. 13, the hard polymer coupler 152 alone forms the overmould layer to provide the impedance matching means.

In other examples of the optimised inertial piezoelectric actuator as shown in FIG. 13, the coupler 152 may be used to couple to a second piezoelectric element positioned substantially parallel to piezoelectric element 151 in a stacked piezoelectric transducer. In this way there may be more than one additional resonator element making up the piezoelectric actuator transducer, with the overmould layer arranged to surround all or some of this piezoelectric device.

In other examples of the optimised inertial piezoelectric actuator as shown in FIG. 13, the coupler 152 could may have a shore A or D hardness greater than or less than 100. The Shore A or D hardness may up to 150.

In other examples of the optimised inertial piezoelectric actuator as shown in FIG. 13, velocity or force may be coupled to the load, or velocity and force may be coupled to the load, or power, velocity and force may be coupled to the load.

In other examples of the optimised inertial piezoelectric actuator as shown in FIG. 13, the thickness of the soft elastomer 153 may be less than or greater than 0.5 mm, and in other examples the soft elastomer 153 has a Shore A hardness less than or greater than 20.

In other examples of the optimised inertial piezoelectric actuator as shown in FIG. 13, the thickness of the soft elastomer 153 varies across the piezoelectric bimorph 151. The thickness may be less at the centre of the resonator 151 than at the ends, or the thickness may be greater at the centre than the ends.

In other examples of the optimised simply supported piezoelectric actuator as shown in FIG. 13, the soft elastomer 153 is only applied to one side of the piezoelectric bimorph 151.

In other examples of the optimised simply supported piezoelectric actuator as shown in FIG. 13, the soft elastomer feet 155 may be at a position other than $\frac{1}{3}^{rd}$ the way from the end of the piezoelectric bimorph 151, such as at the mid point or any other suitable position.

In other examples of the optimised simply supported piezoelectric actuator as shown in FIG. 13, the soft elastomer feet 155 may be of a different geometry to that as shown in FIG. 13 if they continue to function as 'catcher', as would be appreciated by the person skilled in the art.

In other examples of the optimised simply supported piezoelectric actuator as shown in FIG. 13, there may be more than one the soft elastomer foot 155 along either side of the piezoelectric element 151.

In other examples of the optimised simply supported piezoelectric actuator as shown in FIG. 13, the piezoelectric element 151 may only have one part extending laterally from the support 152. This means for example that the piezoelectric beam on the right hand side of the coupler 152 may be omitted, the transducer then not being symmetrical.

This means that other examples of the optimised simply supported piezoelectric actuator as shown in FIG. 13 may be symmetrical or asymmetrical (a cantilever type arrangement). In one example of a cantilever type arrangement the symmetrical example shown in FIG. 13 may be essentially cut in half—with a piezoelectric element only extending to one side of the support. In such an asymmetric case the frequency responses may look the same, or similar, to that shown for the symmetrical example shown in FIG. 13, except that there may be only half the blocked-force generated as would be anticipated for symmetrical arrangement.

In other examples of the optimised simply supported piezoelectric actuator as shown in FIG. 13, the soft elastomer feet 155 may be omitted.

In other examples of the optimised simply supported configuration shown in the above figures, it is clear that such a simple support configuration tending towards an optimised simple support configuration providing the required or desired boundary conditions for a simple support, could be applied in other situations to that for the mounting or coupling of a transducer. For example, the simple support could be used to mount a touchscreen panel, and/or loudspeaker panel. Such a simple support as described above could be used to mount around the edge or periphery of the touchscreen or loudspeaker panel.

The invention claimed is:

1. A device comprising:
a touch screen; and
a transducer coupled to the touch screen, the transducer comprising:
a piezoelectric beam, supporting on at least one major surface a polymer of Shore A hardness less than 30;
a mechanical ground; and
at least two supports coupling the mechanical ground and the piezoelectric beam at opposite lateral ends of the beam in an arrangement that permits pivotal movement of the beam about the supports and reduces translational movement about the supports;
wherein each support comprises an elastomer having a Shore A hardness more than 40 and a Shore D hardness less than 100; and
wherein the beam and the touch screen are coupled at one of the at least one major surface.

2. The device of claim 1, wherein the polymer of Shore A hardness less than 30 is an elastomer or a rubber.

3. The device of claim 1, wherein the polymer of Shore A hardness encapsulates the beam.

4. The device of claim 1, wherein the supports each have thickness of 1 mm or greater.

5. The device of claim 1, wherein the supports each have thickness of less than 1 mm.

6. The device of claim 1, wherein the polymer of Shore A hardness less than 30 has a thickness of 0.5 mm or greater in a direction perpendicular to a plane defined by the beam.

7. The device of claim 1, wherein the polymer of Shore A hardness less than 30 has a thickness of less than 0.5 mm in a direction perpendicular to a plane defined by the beam.

8. The device of claim 1, wherein the beam comprises a uni-morph.

9. The device of claim 1, wherein the beam comprises a bi-morph.

10. The device of claim 1, wherein the lateral ends of the beam partially extend into each of the at least two supports.

11. The device of claim 1, wherein each support has a restraining layer surrounding substantially all surfaces of the respective support, wherein each respective layer prevents each respective support from changes in volume.

12. A device comprising:
a touch screen; and
a transducer coupled to the touch screen, the transducer comprising:
a piezoelectric beam, supporting on at least one major surface a polymer of Shore A hardness less than 30; and
a coupler coupling the beam and the touchscreen, the coupler comprising an elastomer having a Shore A hardness more than 40 and a Shore D hardness less than 100.

13. The device of claim 12, wherein the coupler is positioned at the center of the beam.

14. The device of claim 12, wherein the coupler is positioned at one of the lateral edges of the beam.

15. The device of claim 12, wherein the polymer of Shore A hardness less than 30 is an elastomer or a rubber.

16. The device of claim 12, wherein the polymer of Shore A hardness encapsulates the beam.

17. The device of claim 12, wherein the polymer of Shore A hardness less than 30 has a thickness of 0.5 mm or greater in a direction perpendicular to a plane defined by the beam.

18. The device of claim 12, wherein the polymer of Shore A hardness less than 30 has a thickness of less than 0.5 mm in a direction perpendicular to a plane defined by the beam.

19. The device of claim 12, wherein the beam comprises a uni-morph or a bi-morph.

20. The device of claim 12, further comprising one or more supports coupling the beam and the touchscreen, wherein the one or more supports comprise a polymer of Shore A hardness less than 30.

* * * * *